United States Patent
Jin et al.

(10) Patent No.: US 9,318,487 B2
(45) Date of Patent: Apr. 19, 2016

(54) HIGH PERFORMANCE POWER CELL FOR RF POWER AMPLIFIER

(71) Applicant: Taiwan Semiconductor Manufacturing Co., Ltd., Hsin-Chu (TW)

(72) Inventors: Jun-De Jin, Hsinchu (TW); Tzu-Jin Yeh, Hsinchu (TW); Chewn-Pu Jou, Chutung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 212 days.

(21) Appl. No.: 13/937,542

(22) Filed: Jul. 9, 2013

(65) Prior Publication Data

US 2015/0014786 A1    Jan. 15, 2015

(51) Int. Cl.
*H01L 27/088* (2006.01)
*H03F 1/22* (2006.01)
*H01L 21/8238* (2006.01)
*H01L 27/095* (2006.01)
*H03F 3/213* (2006.01)
*H01L 27/092* (2006.01)

(52) U.S. Cl.
CPC ........ *H01L 27/0883* (2013.01); *H01L 21/8238* (2013.01); *H01L 21/823821* (2013.01); *H01L 21/823828* (2013.01); *H01L 21/823885* (2013.01); *H01L 27/095* (2013.01); *H01L 27/0922* (2013.01); *H03F 1/223* (2013.01); *H01L 27/092* (2013.01); *H03F 3/213* (2013.01)

(58) Field of Classification Search
CPC .................. H01L 27/0883; H01L 21/823828; H01L 21/823821; H01L 21/8238; H03F 1/223; H03F 3/213
USPC ............ 257/392; 438/199, 268; 330/307, 311
See application file for complete search history.

(56) References Cited

U.S. PATENT DOCUMENTS

| | | | |
|---|---|---|---|
| 6,864,131 B2 * | 3/2005 | Thornton ...................... 438/169 |
| 7,969,243 B2 * | 6/2011 | Bracale ............... H01L 27/0617 330/277 |
| 9,071,203 B2 * | 6/2015 | Yeh ......................... H03F 3/213 |
| 2005/0029592 A1 * | 2/2005 | Campbell ............. H01L 21/743 257/347 |
| 2010/0109083 A1 * | 5/2010 | Kim et al. ...................... 257/337 |
| 2010/0252879 A1 * | 10/2010 | Ogawa .............. H01L 29/66666 257/329 |
| 2014/0138749 A1 * | 5/2014 | Huang ................ H01L 27/0623 257/273 |
| 2014/0332858 A1 * | 11/2014 | Chen ................. H01L 29/42316 257/268 |

* cited by examiner

*Primary Examiner* — John P Dulka
(74) *Attorney, Agent, or Firm* — Duane Morris LLP

(57) ABSTRACT

A power cell designed for an RF power amplifier comprises an enhancement MOSFET formed in an P-Well in an P-Substrate and a depletion or Schottky MOSFET formed in an N-Well in the same P-Substrate with a horizontal or a vertical channel between the source, drain, and gate electrodes of the depletion or Schottky MOSFET. The source node of the enhancement MOSFET and source node of the depletion or Schottky MOSFET are connected together to form the power cell.

18 Claims, 7 Drawing Sheets

HIGH PERFORMANCE POWER CELL FOR RF POWER AMPLIFIER

FIELD OF THE INVENTION

This disclosure relates to semiconductor fabrication generally, and more specifically to a power cell for a radio frequency power amplifier.

BACKGROUND

A radio frequency (RF) power amplifier is a type of electronic amplifier used to convert a low-power radio-frequency signal into a larger signal of significant power. The RF power amplifier typically comprises multiple power cells. Each of the power cells includes one or more power transistors designed to optimize efficiency, linearity, output, and cost of the power amplifier.

One commonly-used application of the RF power amplifier is to drive a transmitting antenna of a transmitter or transceiver of a communication device for voice and data communication. Since mobile communication devices such as cell phones are increasingly operating under multiple modes and multiple bands (MMMB) during communication, where most of integrated circuits (ICs) in the mobile communication devices are manufactured using complementary metal oxide semiconductor (CMOS) technology, the cost and performance of the power cells manufactured with CMOS technology and used by the RF power amplifiers in the mobile communication devices are becoming very important.

DETAILED DESCRIPTION

Figure 1A:
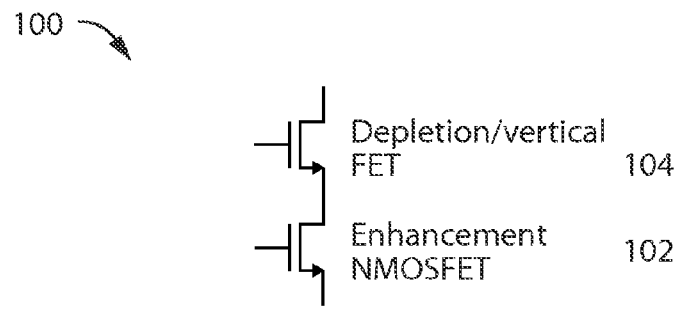
FIGS. 1A, 1B, and 1C show schematic view, front cross section view, and top cross section view, respectively, of an example of a power cell having an enhancement NMOSFET in combination with a depletion FET having a vertical channel.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The inventors have discovered that a series of power cells designed for RF power amplifiers used in mobile/cellular communication devices can offer important advantages. Each of these power cells utilizes an enhancement MOSFET in combination with a depletion FET or a Schottky FET having a vertical or a horizontal channel, respectively. The enhancement MOSFET serves as the main gain stage for the power cell, while the depletion FET or Schottky FET having a vertical or horizontal channel is able to sustain a large voltage swing and to control the signal current of the power cell precisely from multiple directions. As a result, such power cell design, combining the enhancement MOSFET with the depletion FET or Schottky FET having a vertical or horizontal channel, achieves good performance and reliability for the power cell with small chip area at a low cost for the RF power amplifiers used for mobile communications.

As referred to hereinafter, the term MOSFET refers to a metal-oxide-semiconductor field-effect transistor used for amplifying or switching electronic signals. The MOSFET typically has a source (S), a gate (G), and a drain (D) terminal/node as its contacts for connection with other transistors or devices. The term "enhancement MOSFET" refers to an MOSFET operating in the enhancement mode where a voltage drop across the oxide layer of the MOSFET induces a conducting channel between the source and drain contacts of the MOSFET via the field effect. The term "enhancement" refers to the increase of conductivity with increase in oxide field that adds carriers to the channel, also referred to as the inversion layer. The term "depletion MOSFET" or "depletion FET" refers to an MOSFET operating in the depletion mode where the (horizontal or vertical) channel consists of carriers in a surface impurity layer of opposite type to the substrate, and conductivity is decreased by application of a field that depletes carriers from this surface layer. The term "Schottky FET" refers to an MOSFET, which utilizes a reverse biased Schottky barrier to provide a depletion region, wherein the Schottky barrier is a potential barrier formed at a metal-semiconductor junction which has rectifying characteristics suitable for use as a diode.

Figure 1B:
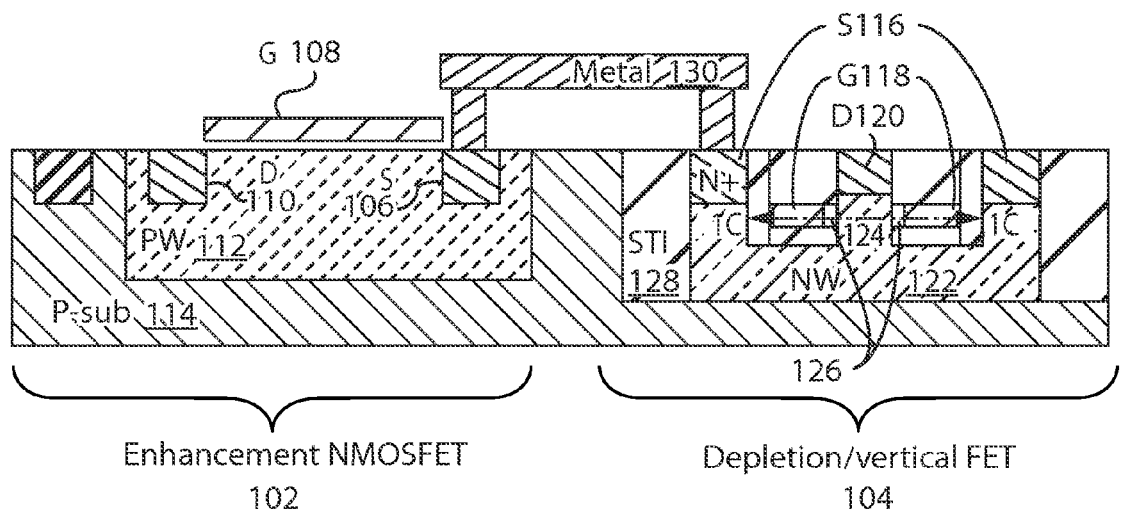
Figure 1C:
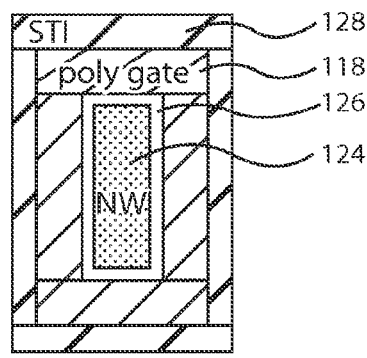

FIGS. 1A, 1B, and 1C show schematic view, front cross section view, and top-cross section view (taken along section line 1C-1C of FIG. 1B), respectively, of an example of power cell 100 having an enhancement NMOSFET 102 in combination with depletion FET 104 having a vertical channel. As shown in FIG. 1A, enhancement NMOSFET 102 placed at the bottom of the power cell is the main gain stage while depletion FET 104 with vertical channel placed at the top of the power cell 100 is used to sustain a large voltage swing of the power cell and to control the signal current of the power cell. As shown in FIG. 1B, enhancement NMOSFET 102 having source node (S) 106, gate electrode (G) 108, and drain node (D) 110 is formed in P-Well (PW) 112 in P-Substrate 114. Depletion FET 104 having terminals S 116, G 118, and D 120 is formed in N-Well NW 122 in the same P-Substrate 114. Here, source node 116 and gate electrode 118 of depletion FET 104 are of N+ material and polycrystalline silicon material, respectively, and each is laid out symmetrically on both sides of drain node 120 in multiple components, wherein the components of each of S 116 and G 118 are connected together through metal contacts, conductive lines, and conductive vias between different metal layers of the interconnect structure of the power cell (not shown). Under such layout of depletion FET 104, vertical channel 124 is formed in NW 122 between S 116 (from bottom) and D 120 (from top), with G 118 on the left and the right side of channel 124 separated by oxide region 126. As a result, depletion FET 104 with vertical channel can exercise precise control over the current in vertical channel 124 from both vertical direction (between source node 116 and drain node 120) and horizontal directions (between components of gate electrode 118). In addition, the pinch-off voltage (e.g., the voltage at which the electric current is impeded or switched off completely) of the power cell 100 can be reduced significantly due to the ability of depletion FET 104 to control the switch off of the current in vertical channel 124 from multiple directions.

In some embodiments, the two FETs of power cell 100 are separated by a shallow trench isolation (STI) region 128 formed surrounding depletion FET 104 in P-Substrate 114. The respective source nodes of the two FETs, 106 and 116, are connected with each other via metal interconnection 130 to form power cell 100.

Figure 2A:
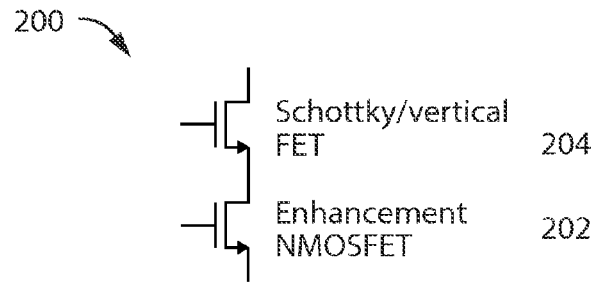
FIGS. 2A, 2B, and 2C show schematic view, front cross section view, and top cross section view, respectively, of an example of a power cell having an enhancement NMOSFET in combination with a Schottky FET having a vertical channel.
Figure 2B:
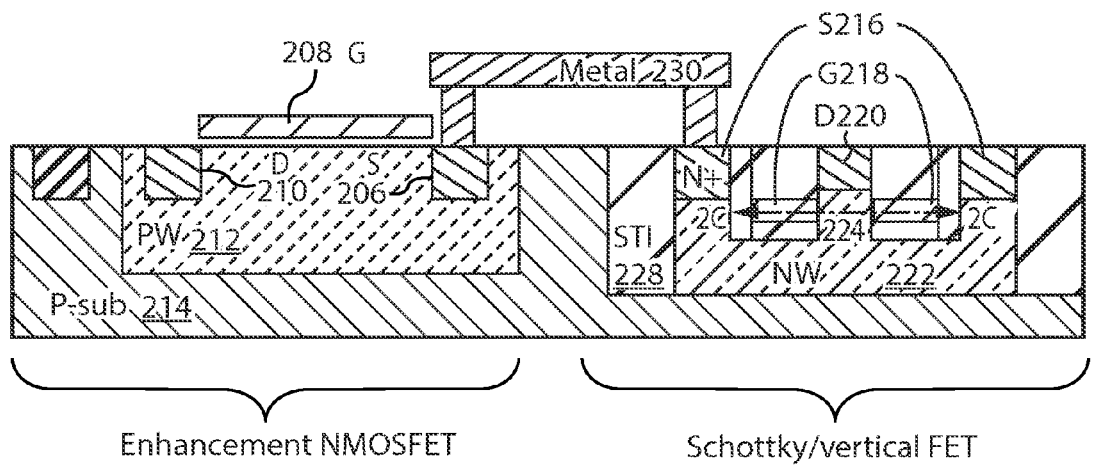
Figure 2C:
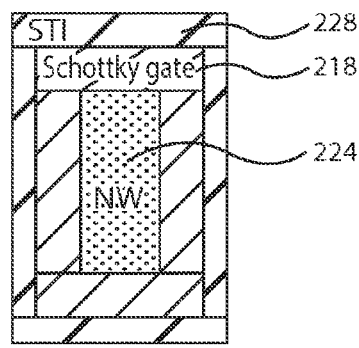

FIGS. 2A, 2B, and 2C show schematic view, front cross section view, and top-cross section view (taken along section line 2C-2C of FIG. 2B), respectively, of an example of power cell 200 having an enhancement NMOSFET 202 in combination with Schottky FET 204 having a vertical channel. As shown in FIG. 2B, enhancement NMOSFET 202 having source node (S) 206, gate electrode (G) 208, and drain node (D) 210 is formed in P-Well PW 212 in P-Substrate 214. Schottky FET 204 having terminals S 216, G 218, and D 220 is formed in N-Well NW 222 in the same P-Substrate 214. Here, source node 216 and gate electrode 218 are of N+ material and metal, respectively, and each is laid out symmetrically on both sides of drain node 220 in multiple components, wherein the components of each of S 216 and G 218 are connected together through metal contacts, conductive lines, and conductive vias between different metal layers of the interconnect structure of the power cell (not shown). Similar to the layout for depletion FET 104 shown in FIG. 1B, vertical channel 224 is formed in NW 222 between S 216 (from bottom) and D 220 (from top), with G 218 on the left and the right side of channel 224. Unlike depletion FET 104 shown in FIG. 1B though, the gate electrode 218 comprises metal instead of polycrystalline silicon for Schottky FET 204, and there is no oxide region used to separate gate electrode 218 from the left and right sides of vertical channel 224. Like depletion FET 104, Schottky FET 204 with the vertical channel 224 can also exercise precise control over the current in vertical channel 224 from both vertical and horizontal directions. Further, the pinch-off voltage of the power cell 200 can be reduced significantly due to the ability of Schottky FET 204 to control the switching off of the current in vertical channel 224 from multiple directions.

In some embodiments, similar to power cell 100 shown in FIG. 1B, the two FETs 202, 204 of power cell 200 are separated by a shallow trench isolation (STI) region 228 formed surrounding Schottky FET 204 in P-Substrate 114. The respective source nodes of the two FETs, 206 and 216, are connected with each other via metal interconnection 230 to form power cell 200.

Figure 3:
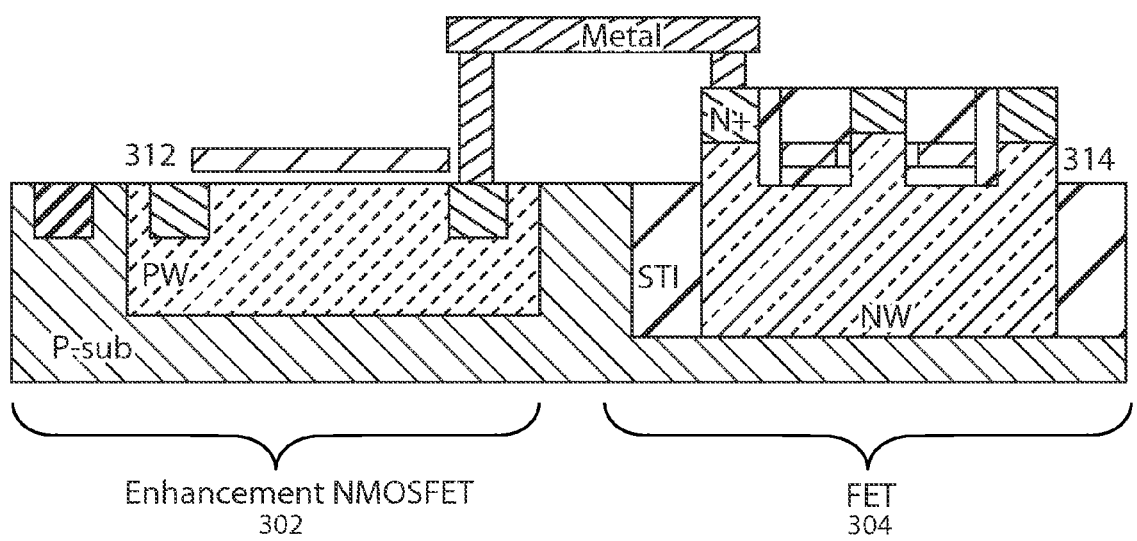
FIG. 3 shows an example of a cross section view of a layout of a power cell where the gate of an enhancement NMOSFET and the gate of a depletion FET shown in FIG. 1 or a Schottky FET having a vertical channel shown in FIG. 2 are at the same horizontal level.

In some embodiments, for power cells that include the enhancement MOSFET 102 or 202 in combination with a depletion FET or Schottky FET 104 or 204 having a vertical channel 124 or 224 as shown in FIGS. 1 and 2, gate electrode 314 of the depletion FET or Schottky FET 304 on the right-hand side of the example shown in FIG. 3 is placed at the same horizontal level as the gate electrode 312 of the enhancement NMOSFET 302 on the left-hand side of FIG. 3. Such layout allows the gates of both the enhancement MOSFET 302 and the depletion FET or Schottky FET 304 to be formed in one single step during the manufacturing process.

Figure 4A:
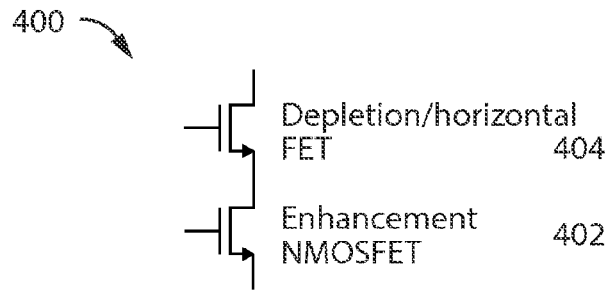
FIGS. 4A, 4B, and 4C show schematic view, front cross section view, and top cross section view, respectively, of an example of a power cell having an enhancement NMOSFET in combination with depletion FET having a horizontal channel.
Figure 4B:
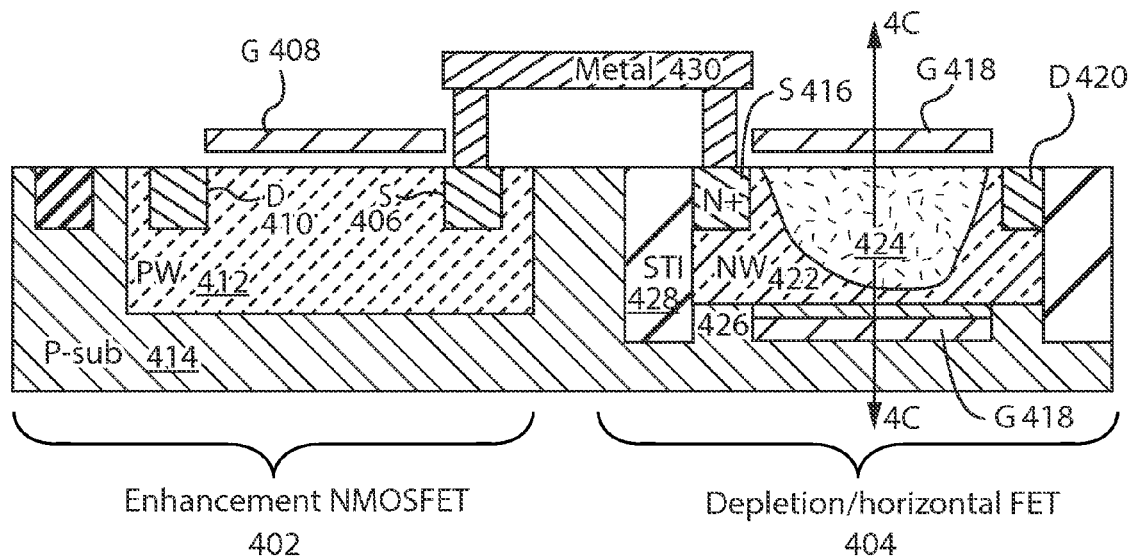
Figure 4C:
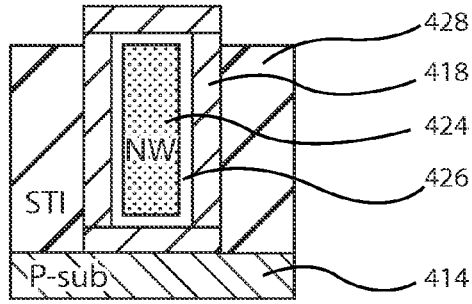

FIGS. 4A, 4B, and 4C show schematic view, front cross section view, and top-cross section view (taken along section line 4C-4C of FIG. 4B), respectively, of an example of power cell 400 having an enhancement NMOSFET 402 in combination with depletion FET 404 having a horizontal channel. As shown in FIG. 4A, enhancement NMOSFET 402 placed at the bottom of the power cell is the main gain stage, while depletion FET 404 with horizontal channel placed at the top of the power cell 400 is used to sustain a large voltage swing of the power cell and to control the signal current of the power cell. As shown in FIG. 4B, enhancement NMOSFET 402 having source node (S) 406, gate electrode (G) 408, and drain node (D) 410 is formed in P-Well PW 412 in P-Substrate 414. Depletion FET 404 having terminals S 416, G 418, and D 420 is formed in N-Well NW 422 in the same P-Substrate 414. Here, source node 416 and gate electrode 418 of depletion FET 404 are of N+ material and polycrystalline silicon material, respectively, and gate electrode 418 is symmetrically placed in two components on top and bottom (separated by oxide region 426) of horizontal channel 424, respectively, wherein horizontal channel 424 is formed between S 416 (left) and D 420 (right). Under such layout, depletion FET 404 with horizontal channel can exercise precise control over the current in horizontal channel 424 from both vertical directions (between the multiple components of gate electrode 418) and horizontal direction (between source node 416 and drain node 420). In addition, the pinch-off voltage of power cell 400 can be reduced significantly due to the ability of depletion FET 404 to control the switch off of the current in horizontal channel 424 from multiple directions.

In some embodiments, the two FETs of power cell 400 are separated by a shallow trench isolation (STI) region 428 formed surrounding depletion FET 404 in P-Substrate 414. The respective source nodes of the two FETs, 406 and 416, are connected with each other via metal interconnection 430 to from the power cell 400.

Figure 5A:
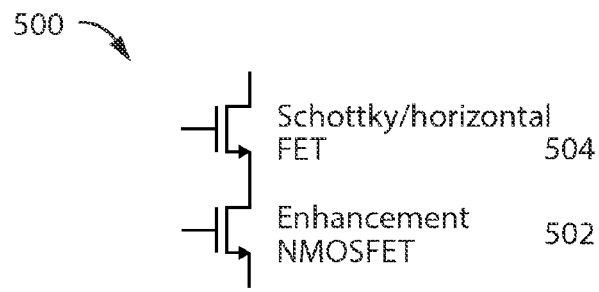
FIGS. 5A, 5B, and 5C show schematic view, front cross section view, and top cross section view, respectively, of an example of a power cell having an enhancement NMOSFET in combination with Schottky FET having a horizontal channel.
Figure 5B:
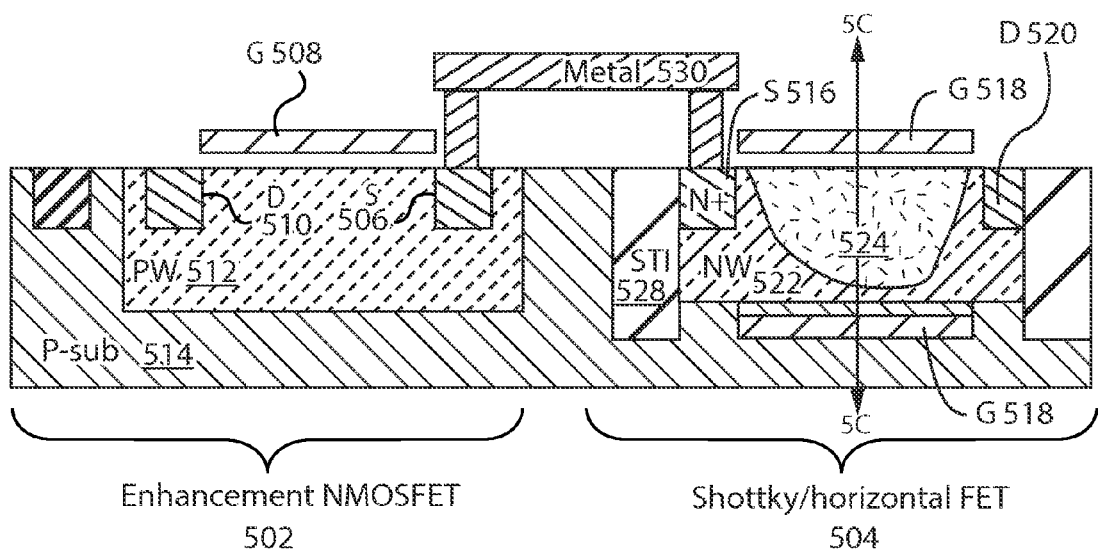
Figure 5C:
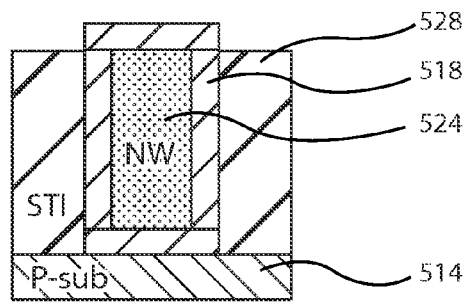

FIGS. 5A, 5B, and 5C show schematic view, front cross section view, and top-cross section view (taken along section line 5C-5C of FIG. 5B), respectively, of an example of power cell 500 having an enhancement NMOSFET 502 in combination with Schottky FET 504 having a horizontal channel. As shown in FIG. 5B, enhancement NMOSFET 502 having source node (S) 506, gate electrode (G) 508, and drain node (D) 510 is formed in P-Well PW 512 in P-Substrate 514. Schottky FET 504 having terminals S 516, G 518, and D 520 is formed in N-Well NW 522 in the same P-Substrate 514. Here, source node 516 and gate electrode 518 of Schottky FET 504 are of N+ material and metal, respectively, and gate electrode 518 is symmetrically placed in two components on top and bottom of horizontal channel 524, respectively, wherein horizontal channel 524 is formed between S 516

(left) and D 520 (right). Similar to depletion FET 404 with horizontal channel shown in FIG. 4B, Schottky FET 504 with horizontal channel can exercise precise control over the current in horizontal channel 524 from both vertical (between the two components of gate electrode 518) and horizontal (between source node 516 and drain node 520) directions under such layout. In addition, the pinch-off voltage of power cell 500 can be reduced significantly due to due to the ability of Schottky FET 504 to control the switch off of the current in horizontal channel 524 from multiple directions.

In some embodiments, similar to power cell 400 shown in FIG. 4B, the two FETs of power cell 500 are separated by a shallow trench isolation (STI) region 528 formed surrounding depletion FET 504 in P-Substrate 514. The respective source nodes of the two FETs, 506 and 516, are connected with each other via metal interconnection 530 to from power cell 500.

Figure 6:
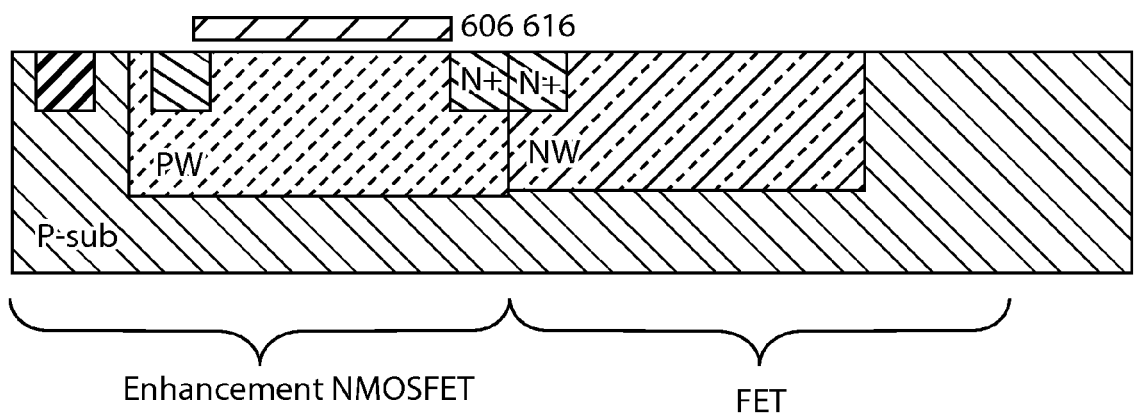
FIG. 6 shows an example of a cross section view of a layout of a power cell where an enhancement NMOSFET and a depletion FET or Schottky FET share their source nodes.

Since the enhancement MOSFET works with either the depletion FET or the Schottky FET as one device (power cell), the shallow trench isolation (STI) regions 128, 228, 428 and 528 that are used to separate the two FETs (in order to make sure they can function independently) are not needed. Consequently, as shown the example of the layout of the power cell in FIG. 6, in some embodiments where a STI is not present, N+ source nodes 606 and 616 of the enhancement MOSFET and the depletion FET or Schottky FET, respectively, can be placed next to each other and shared between the two FETs. As a result, the metal interconnection wires that are used to connect the N+ source nodes of the two FETs in the power cells shown in FIGS. 1, 2, 4, and 5 are no longer needed.

Figure 7:
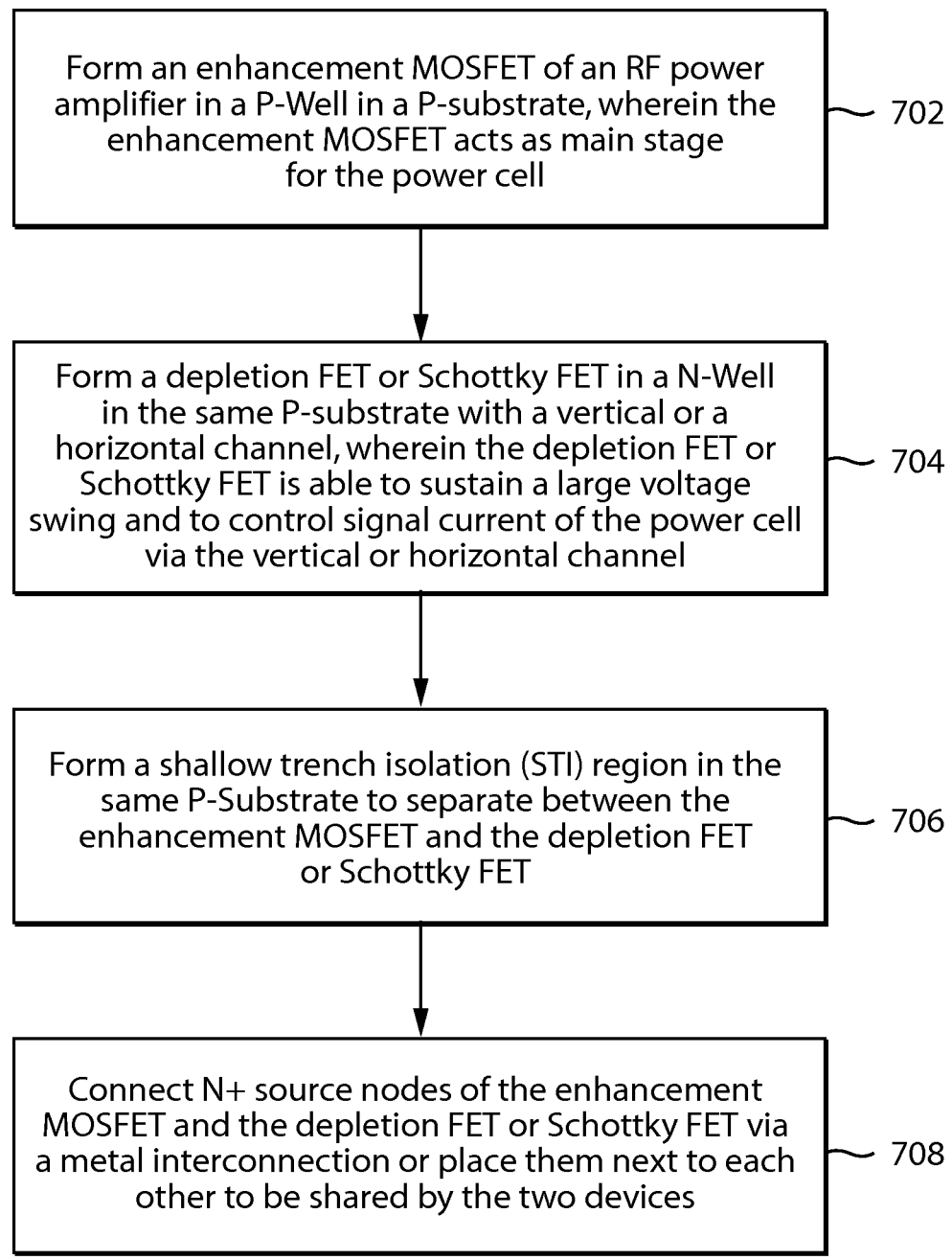
FIG. 7 is a flow chart of a method for forming a high performance power cell for an RF power amplifier wherein the power cell includes an enhancement MOSFET and a depletion or Schottky FET with a vertical or horizontal channel.

FIG. 7 is a flow chart 700 of a method for forming a high performance power cell for an RF power amplifier wherein the power cell includes an enhancement MOSFET and a depletion or Schottky FET with a vertical or a horizontal channel.

At step 702, an enhancement MOSFET of an RF power amplifier is formed in a P-Well in a P-substrate, wherein the enhancement MOSFET acts as main stage for the power cell.

At step 704, a depletion FET or Schottky FET is formed in a N-Well in the same P-substrate with a vertical or a horizontal channel, wherein the depletion FET or Schottky FET is able to sustain a large voltage swing and to control signal current of the power cell via the vertical or horizontal channel.

At step 706, an shallow trench isolation (STI) region is formed in the same P-Substrate to separate between the enhancement MOSFET and the depletion FET or Schottky FET.

At step 708, source nodes of the enhancement MOSFET and the depletion FET or Schottky FET are connected via a conductive interconnection, which can be metal or poly, or placed next to each other to be shared by the two devices.

In some embodiments, a power cell designed for an RF power amplifier comprises a first MOSFET formed in an P-Well in an P-Substrate and a second MOSFET formed in an N-Well in the same P-Substrate, the second MOSFET having a vertical channel and a gate electrode, wherein the vertical channel is formed so that source and drain nodes of the second MOSFET control current in the vertical channel in a vertical direction and the gate electrode of the second MOSFET control the current in the vertical channel in a horizontal direction. The source node of the first MOSFET and the source node of the second MOSFET are connected together to form the power cell.

In some embodiments, a shallow trench isolation (STI) region is formed in the same P-Substrate, wherein the STI region separates the first MOSFET and the second MOSFET.

In some embodiments, a conductive interconnection is formed, which connects the source node of the first MOSFET and the source node of the second MOSFET.

In some embodiments, the source node of the first MOSFET and the source node of the second MOSFET are located next to each other and shared between the first MOSFET and the second MOSFET.

In some embodiments, the first MOSFET is an enhancement NMOSFET.

In some embodiments, the second MOSFET is a depletion MOSFET having a gate electrode comprising polycrystalline silicon material.

In some embodiments, the second MOSFET is a Schottky MOSFET having a gate electrode comprising metal.

In some embodiments, the gate electrode of the first MOSFET and the gate electrode of the second MOSFET are located at the same horizontal level.

In some embodiments, a power cell designed for an RF power amplifier comprises a first MOSFET formed in an P-Well in an P-Substrate and a second MOSFET formed in an N-Well in the same P-Substrate, the second MOSFET having a horizontal channel and a gate electrode, wherein the horizontal channel is formed so that source and drain nodes of the second MOSFET control current in the horizontal channel in a horizontal direction and the gate electrode of the second MOSFET controls the current in the horizontal channel in a vertical direction. The source node of the first MOSFET and the source node of the second MOSFET are connected together to form the power cell.

In some embodiments, the source node of the first MOSFET and the source node of the second MOSFET are located next to each other and shared between the first MOSFET and the second MOSFET.

In some embodiments, the second MOSFET with the horizontal channel is a depletion MOSFET having a gate electrode comprising polycrystalline silicon material.

In some embodiments, the second MOSFET with the horizontal channel is a Schottky MOSFET having a gate electrode comprising metal.

In some embodiments, a method comprises forming a first MOSFET in an P-Well in an P-Substrate, and forming a second MOSFET in an N-Well in the same P-Substrate with a vertical channel or a horizontal channel between a source, a drain, and a gate electrode of the second MOSFET in the N-Well. The method further comprises connecting a source node of the first MOSFET and the source node of the second MOSFET together to form the power cell.

In some embodiments, the method further comprises forming the vertical channel so that the source and drain nodes of the second MOSFET control current in the vertical channel in a vertical direction and the gate electrode of the second MOSFET controls the current in the vertical channel in a horizontal direction.

In some embodiments, the method further comprises forming the horizontal channel so that the source and drain nodes of the second MOSFET control current in the horizontal channel in a horizontal direction and gate electrode of the second MOSFET controls the current in the horizontal channel in a vertical direction.

In some embodiments, the method further comprises forming a shallow trench isolation (STI) region in the same P-Substrate, wherein the STI region separates the first MOSFET and the second MOSFET.

In some embodiments, the method further comprises forming a conductive interconnection that connects the source node of the first MOSFET and the source node of the second MOSFET.

In some embodiments, the method further comprises locating the source node of the first MOSFET and the source node of the second MOSFET next to each other, to be shared between the first MOSFET and the second MOSFET.

In some embodiments, the method further comprises forming the second MOSFET as a depletion MOSFET having a gate electrode comprising polycrystalline silicon material.

In some embodiments, the method further comprises forming the second MOSFET as a Schottky MOSFET having a gate electrode made of metal.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A power cell designed for an RF power amplifier, comprising:
    a first MOSFET formed in a P-Well in a P-Substrate;
    a second MOSFET formed in an N-Well in the same P-Substrate, the second MOSFET having a vertical channel, a source node, a drain node, and a gate electrode, wherein the vertical channel is formed in the N-Well between the source node and the drain node with components of the gate electrode on left and right sides of the vertical channel, respectively, each of the components of the gate electrode being separated from the vertical channel by an oxide region, wherein components of the source node and the gate electrode are each arranged symmetrically on both sides of the drain node, respectively, to control current in the vertical channel in a vertical direction between the source node and the drain node and in a horizontal direction between the components of the gate electrode;
    wherein a source node of the first MOSFET and the source node of the second MOSFET are connected together to form the power cell.

2. The device of claim 1, further comprising:
   a shallow trench isolation (STI) region formed in the same P-Substrate, wherein the STI region separates the first MOSFET and the second MOSFET.

3. The device of claim 1, further comprising:
   a conductive interconnection that connects the source node of the first MOSFET and the source node of the second MOSFET.

4. The device of claim 1, wherein:
   the source node of the first MOSFET and the source node of the second MOSFET are located next to each other and shared between the first MOSFET and the second MOSFET.

5. The device of claim 1, wherein:
   the first MOSFET is an enhancement NMOSFET.

6. The device of claim 1, wherein:
   the second MOSFET is a depletion MOSFET having the gate electrode comprising polycrystalline silicon material.

7. The device of claim 1, wherein:
   the second MOSFET is a Schottky MOSFET having the gate electrode comprising metal.

8. The device of claim 1, wherein:
   a gate electrode of the first MOSFET and the gate electrode of the second MOSFET are located at the same horizontal level.

9. A power cell designed for an RF power amplifier, comprising:
    a first MOSFET formed in a P-Well in a P-Substrate;
    a second MOSFET formed in an N-Well in the same P-Substrate, the second MOSFET having a horizontal channel, a source node, a drain node, and a gate electrode, wherein the horizontal channel is formed between the source node and the drain node with the gate electrode comprising two components symmetrically arranged above and below the horizontal channel, respectively, at least the bottom component being separated from the horizontal channel by an oxide region, such that the second MOSFET controls current flow in the horizontal channel in a horizontal direction between the source node and the drain node and a vertical direction between the two components of the gate electrode;
    wherein a source node of the first MOSFET and the source node of the second MOSFET are connected together to form the power cell.

10. The device of claim 9, wherein:
    the source node of the first MOSFET and the source node of the second MOSFET are located next to each other and shared between the first MOSFET and the second MOSFET.

11. The device of claim 9, wherein:
    the second MOSFET with the horizontal channel is a depletion MOSFET having the gate electrode comprising polycrystalline silicon material.

12. The device of claim 9, wherein:
    the second MOSFET with the horizontal channel is a Schottky MOSFET having the gate electrode comprising metal.

13. A method, comprising:
    forming a first MOSFET in a P-Well in a P-Substrate;
    forming a second MOSFET in an N-Well in the same P-Substrate with a vertical channel or a horizontal channel between a source node and a drain node of the second MOSFET in the N-Well,
    wherein the vertical channel is formed between two components of a gate electrode on left and right sides of the vertical channel, respectively, each component of the gate electrode separated from the vertical channel by an oxide region, wherein multiple components of the source node and the gate electrode are each arranged symmetrically on both sides of the drain node, respectively;
    wherein the horizontal channel is formed between two components of a gate electrode, wherein the two components are symmetrically placed above and below the horizontal channel, respectively, and at least the bottom component is separated from the horizontal channel by an oxide region;
    connecting a source node of the first MOSFET and the source node of the second MOSFET together to form the power cell.

14. The method of claim 13, further comprising:
    forming a shallow trench isolation (STI) region in the same P-Substrate, wherein the STI region separates the first MOSFET and the second MOSFET.

15. The method of claim 13, further comprising:
    forming a conductive interconnection that connects the source node of the first MOSFET and the source node of the second MOSFET.

16. The method of claim 13, further comprising:
    locating the source node of the first MOSFET and the source node of the second MOSFET next to each other, to be shared between the first MOSFET and the second MOSFET.

17. The method of claim 13, further comprising:
forming the second MOSFET as a depletion MOSFET having the gate electrode comprising polycrystalline silicon material.

18. The method of claim 13, further comprising:
forming the second MOSFET as a Schottky MOSFET having the gate electrode made of metal.

* * * * *